United States Patent [19]
Maltiel et al.

[11] Patent Number: 4,716,552
[45] Date of Patent: Dec. 29, 1987

[54] METHOD AND APPARATUS FOR NON-DESTRUCTIVE ACCESS OF VOLATILE AND NON-VOLATILE DATA IN A SHADOW MEMORY ARRAY

[75] Inventors: Ron Maltiel, Mountain View; Robert L. Yau, Cupertino, both of Calif.

[73] Assignee: Advanced Micro Devices, Inc., Sunnyvale, Calif.

[21] Appl. No.: 717,348

[22] Filed: Mar. 29, 1985

[51] Int. Cl.$^4$ ............ G11C 13/00; G11C 11/40
[52] U.S. Cl. ........................... 365/222; 365/95
[58] Field of Search ............ 365/228, 189, 230, 222, 365/95

[56] References Cited

U.S. PATENT DOCUMENTS 3,644,907  2/1972  Gricchi et al. .................. 365/95
3,798,621  3/1974  Baitinger et al. ................ 365/95

Primary Examiner—Terrell W. Fears
Attorney, Agent, or Firm—Patrick T. King; Kenneth B. Salomon

[57] ABSTRACT

Circuitry, including a non-volatile dynamic random access memory cell, a sense amplifier and a data latch affords non-destructive accessing and comparison of the data stored within the volatile and non-volatile portion of the memory cell. In certain applications, it is desirable to restore the volatile data to the volatile portion of the memory cell, and the circuitry also provides a path for such restoration.

18 Claims, 2 Drawing Figures

METHOD AND APPARATUS FOR NON-DESTRUCTIVE ACCESS OF VOLATILE AND NON-VOLATILE DATA IN A SHADOW MEMORY ARRAY

CROSS-REFERENCE TO RELATED APPLICATION

Related, co-pending application of particular interest to this invention is application U.S. Ser. No. 654,332, filed Sept. 24, 1984, on behalf of Patrick Chuang, Robert Yau and Ron Maltiel entitled "An Improved Non-Volatile Dynamic RAM Cell", assigned to the assignee of the instant application.

FIELD OF THE INVENTION

This invention relates to electronic memory circuits, and more particularly, to method and circuitry providing non-destructive access to both volatile and non-volatile data.

BACKGROUND OF THE INVENTION

A method and device which provides a non-volatile memory cell capable both of volatile dynamic random access memory (DRAM) storage and non-volatile electrically erasable programmable read-only memory (EEPROM) storage is described in the related co-pending application U.S. Ser. No. 654,332, filed Sept. 24, 1984, on behalf of Patrick Chuang, Robert Yau and Ron Maltiel entitled "An Improved Non-Volatile Dynamic RAM Cell", and that description is hereby incorporated by reference in the instant application. The memory cell disclosed in the related, co-pending application is a non-volatile dynamic RAM (NVDRAM) which operates as an ordinary dynamic RAM cell in one mode of operation, and as a non-volatile ROM cell in another mode of operation.

A shadow memory array composed of a number of NVDRAM cells which can store and compare volatile and non-volatile data is useful in pattern recognition and instrument calibration. However, in the prior art, when recalling the data stored in the non-volatile portion, from the so-called "shadow memory", the data stored in the volatile memory is lost.

SUMMARY OF THE INVENTION

In that the NVDRAM disclosed in the related, co-pending application is capable of storing both the volatile, as well as the non-volatile data, the instant invention provides non-destructive access to both the volatile and non-volatile data. Circuitry is provided which includes the NVDRAM cell disclosed in the related, co-pending application, a sense amplifier, and a data latch. The data from the volatile portion of the NVDRAM cell is temporarily stored in the data latch and then the data from the non-volatile portion of the NVDRAM cell is sensed by the amplifier. These two data may then be compared. In certain applications, it is desirable to restore the volatile data to the volatile portion of the NVDRAM, and the circuitry of the present invention provides a path for such restoration.

DESCRIPTION OF THE PREFERRED EMBODIMENT

Figure 1:
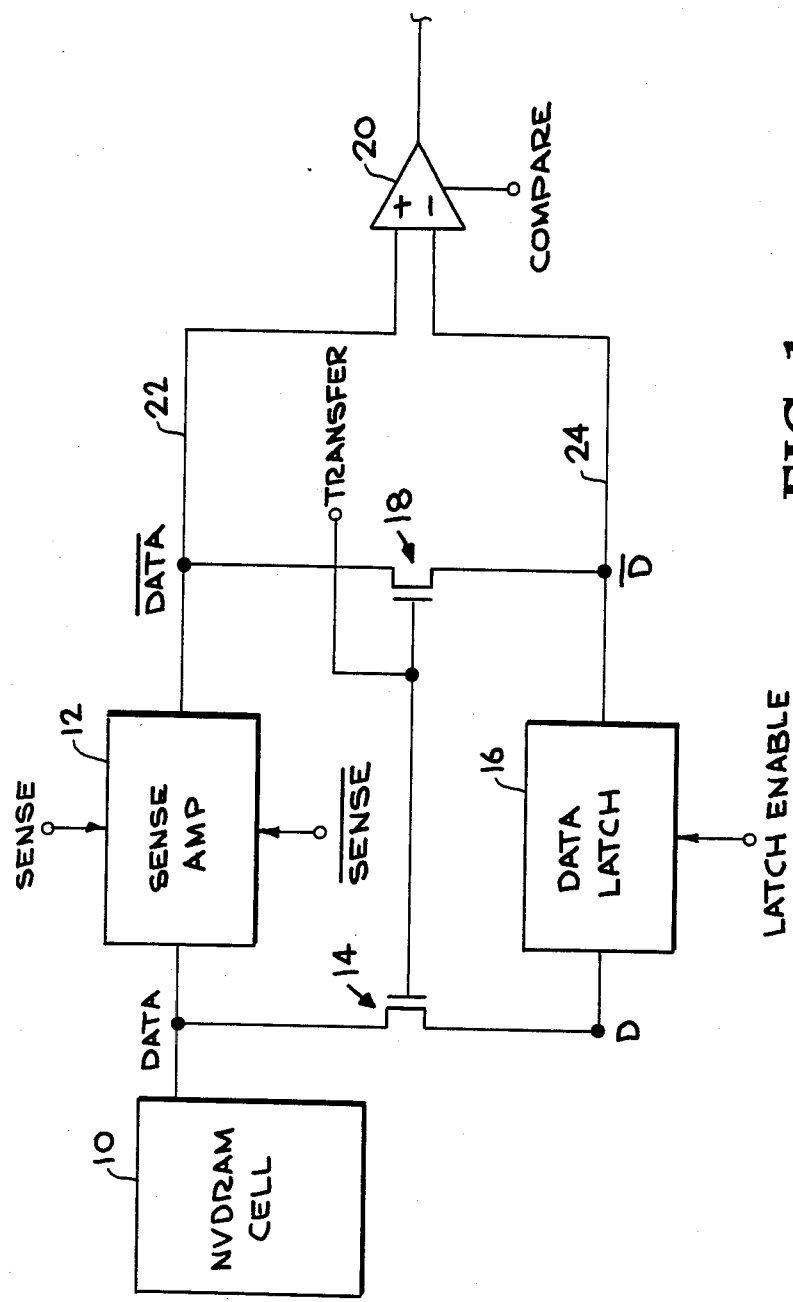
FIG. 1 is a block diagram of the dual storage device of the present invention employing an NVDRAM, a sense amplifier and a latch.

With reference to FIG. 1, the input/output, or bit line, of a NVDRAM cell 10 constructed according to the teachings of the related, co-pending application, is shown connected to a first terminal of a bidirectional sense amplifier 12 and, via a transfer transistor 14, to the input terminal to a data latch 16.

An output terminal of sense amplifier 12 is connected to a first terminal of a second transfer transistor 18 and a second terminal of transistor 18 is connected to an output terminal of data latch 16. The NVDRAM cell 10 has a set of control lines which permit selection of the mode of operation of the cell; this selection is described in detail in the related, co-pending application and incorporated herein by reference. Connection of the NVDRAM 10 to the various voltage sources, and the conducting plate and word control lines is not explicitly shown in FIG. 1; these connections being described in detail in the related, co-pending application and incorporated herein by reference. The operation and construction of bidirectional sense amplifier 12 and data latch 16 are conventional and well-understood by persons of ordinary skill in the art. Accordingly, they will not be described herein.

Sense amplifier 12 receives a pair of timing signals, SENSE and $\overline{\text{SENSE}}$, which, when activated, cause the data at the first terminal of the sense amplifier 12 to be compared to a reference voltage and a signal will subsequently be generated at a second terminal of sense amplifier 12 which corresponds to the complement of the data applied at the first terminal. An active timing signal, TRANSFER, applied to the gate of transfer transistor 14 causes the signal applied at a first terminal of transistor 14, connected to the sense amplifier 12, to be passed to a second terminal of transistor 14, connected in turn to the input terminal of data latch 16. Conversely, an active TRANSFER signal applied to the gate of transfer transistor 14 causes a signal applied at the second terminal of transistor 14 to be passed to the first terminal. Second transfer transistor 18 also receives the TRANSFER signal at a gate which causes passage of signals between the first and second terminals of transistor 18 in the manner described in connection with transistor 14. Data latch 16 receives an ENABLE signal which, when active, causes the latch to retain the data applied to the input terminal until the ENABLE signal is deactivated. The signal at the output terminal of data latch 16 follows the signal applied at the input terminal at all times other than when the ENABLE signal is active. Accordingly, a signal generated on the bit line of NVDRAM cell 10 during a READ operation can be applied to the first terminal of the sense amplifier 12 upon application of the SENSE and $\overline{\text{SENSE}}$ signals to sense amplifier 12. Application of the TRANSFER signal to transistors 14 and 18, will cause the data read from NVDRAM cell 10 to be transferred from sense amplifier 12 to the data latch 16.

As described in the related, co-pending application, the NVDRAM cell 10 is responsive to a set of control signals which cause it to perform a variety of operations: a RECALL operation, a STORE operation, a dynamic RAM (DRAM) READ operation, a DRAM WRITE operation, and a REFRESH operation. The RECALL operation transfers the data stored within the non-volatile portion of cell 10 to the volatile portion for subsequent generation on the bit line of cell 10. Accordingly, depending on the sequential application of certain of these control signals, the contents of the volatile or the non-volatile portion of NVDRAM cell 10 will be generated at the bit line terminal of cell 10.

Illustrative of one application of the instant invention, the output terminals of sense amplifier 12 and data latch 16 are connected to a positive input, and a negative input, respectively, of a comparator 20, via signal lines 22 and 24, respectively. Upon application of a COMPARE signal to the comparator 20, a signal will be generated at an output terminal of comparator 20 indicative of whether the signals at the positive and negative terminals are equal or not. As will be explained below, these signals at the comparator input terminals will be the contents of the non-volatile and volatile portion, respectively, of the NVDRAM cell 10. In this manner, the circuit illustrated in the block diagram of FIG. 1 can be used to temporarily store and compare the contents of the non-volatile and volatile data stored within a NVDRAM cell.

Figure 2:
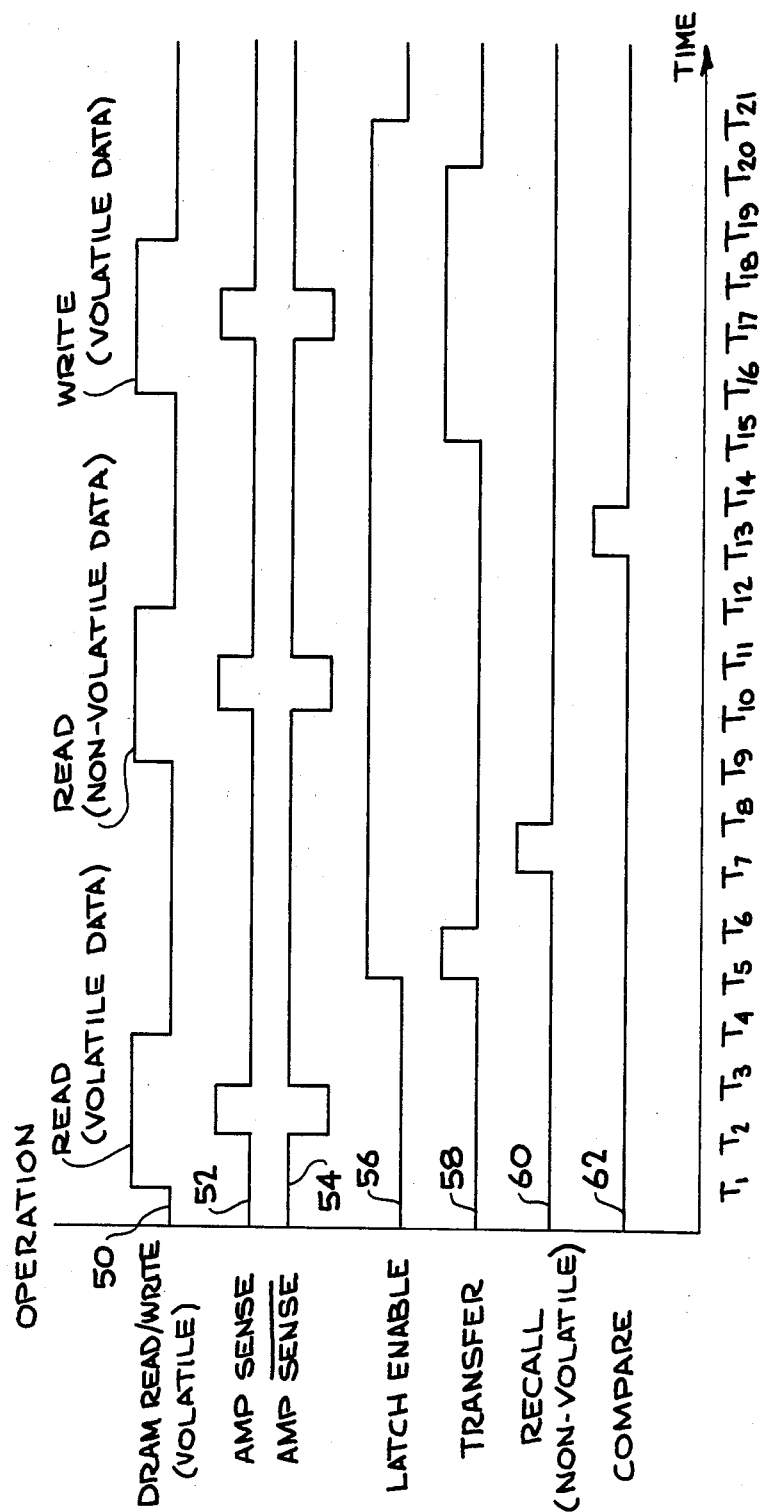
FIG. 2 is a timing diagram of the dual storage device of the present invention.

The operation of the circuit illustrated in FIG. 1 can best be understood with reference to the timing diagram of FIG. 2. Shown in FIG. 2 are the signals to be applied, in the sequence shown, to the various elements of the circuit illustrated in Fig. 1. While the signals in FIG. 2 are shown active HIGH, the signals may be, in fact, an active LOW, and the following explanation of the circuit elements illustrated in FIG. 1 will nonetheless be equally applicable. The control signal applied to the NVDRAM cell 10 which causes a DRAM READ or DRAM WRITE operation to be performed therein is shown in FIG. 2 labelled 50 thereon. As shown, the DRAM READ operation control signal is activated during the time interval beginning at T1 and continuing to T4. In this way, the volatile data is read in the manner described in the related, co-pending application. The sense signals applied to the sense amplifier 12, SENSE and $\overline{SENSE}$, are shown in FIG. 2 labelled 52 and 54, respectively, and as shown are activated beginning at T2, following T1, and deactivated prior to T4 at T3. In this manner, the volatile data is transferred from the NVDRAM cell to the sense amplifier 12 during the interval T1 to T4.

Following T4, at T5, an active ENABLE signal 56 is applied to data latch 16 and an active TRANSFER signal 58 is applied to transfer transistors 14 and 18 beginning at T5 and continuing to T6. This causes the volatile data stored within the sense amplifier 12 during the interval T1 to T4, prior to T5, to be transferred to the data latch 16, via transistors 14 and 18, for temporary storage, during the interval ending at T6. Latch ENABLE signal 56 is kept active until at least T13 so that the volatile data will be retained until that time for comparison.

Beginning at T7, following T6, the RECALL operation control signal 60 is applied to the NVDRAM cell 10, continuing to T8, thereby causing the non-volatile data stored within the cell to be transferred to the volatile portion thereof prior to T8, as described in the related, co-pending application. Following T8, at T9, an active DRAM READ operation control signal 50 is applied to NVDRAM cell 10 which causes the non-volatile data to be generated at the bit line of the cell. The DRAM READ signal 50 is deactivated at T12, following T9.

The sense signals SENSE and $\overline{SENSE}$, 52 and 54, respectively, are again activated at T10, following T9, and deactivated at T11. In this manner, the non-volatile data is transferred from the NVDRAM cell 10 to the sense amplifier 12 during the interval T9 to T12, as explained above.

An active COMPARE signal 62 is then applied to the comparator 20 beginning at T13, following T12, and continuing to T14, during which time a signal will be generated at the output of comparator 20 indicative of whether the non-volative and the volatile data accessed from the NVDRAM cell 10 during the intervals T1 to T4 and T7 to T10, respectively, was equal. At T15, following T14, the active ENABLE signal 56 applied to data latch 16 can be deactivated, unless it is needed, as will now be described.

Since the volatile data stored in the NVDRAM cell 10 is overwritten by the non-volatile data during the RECALL operation, as described in the related, co-pending application, it may be desired to restore the original non-volatile data stored within the data latch 16 to the volatile portion of NVDRAM cell 10. The circuit illustrated in FIG. 1 can be adapted to perform this replacement as follows: Application of any active TRANSFER signal 58 to transistors 14 and 18 at time T15 will cause the volatile data signal stored within latch 16 to be transferred to the two corresponding terminals of the sense amplifier 12 via transfer transistors 14 and 16, respectively. Upon application of an active DRAM WRITE operation control signal 50 applied to NVDRAM cell 10 at time T16, following T15, and the subsequent application to sense amplifier 12 of the SENSE and $\overline{SENSE}$ 52 and 54 signals during the interval T17 to T18, following T16, will cause the volatile data signal to be placed onto signal line 22 and it can be conducted therefrom to the volatile portion of the NVDRAM cell 10 via the bit line in a DRAM WRITE operation, as described more fully in the related, co-pending application. DRAM WRITE signal 50, TRANSFER signal 58, and LATCH ENABLE signal 56, are set inactive at times T19, T20 and T21, respectively, following completion of the DRAM WRITE operation at T18.

The foregoing is a detailed description of a preferred embodiment of the invention. It is understood by persons of ordinary skill in the art that alternative embodiments of the invention are within the scope and spirit of the invention. For example, the method taught by the invention can be utilized whenever it is desired to read non-volatile data from a shadow memory, such as a static non-volatile E$^2$PROM, without destroying the volatile data.

We claim:

1. Apparatus providing non-destructive access to at least two digital data elements comprising:
   memory cell means responsive to access control signals for storing at least a non-volatile digital data element and a volatile digital data element, and for generating at a terminal signals representative of said data stored within said data elements;
   sensing means responsive to said signals generated by said memory cell means for sampling said signals and for generating amplified signals therefrom; and
   latch means responsive to said signals generated by said memory cell means for temporarily storing said signals;
   whereby said digital data element stored in said volatile portion of said memory cell means is read therefrom and temporarily stored in said latch means and said non-volatile digital data element is sampled and a signal generated therefrom by said sensing means.

2. Data access apparatus according to claim 1 further including control means for generating a plurality of control and timing signals including said access control signals and transfer means responsive to one of said control signals, connected to said sensing means for selectively conducting said signals between said sensing means and said latch means upon receipt of said one of said control signals.

3. Data access apparatus according to claim 2 wherein said sensing means has a first terminal connected to said memory cell means and a second terminal and wherein said transfer means comprises a first transistor having a first terminal connected to said first terminal of said sensing means, a second terminal connected to a first terminal of said data latch and a gate connected to said control means, said gate causing said first transistor to enter a conducting state upon receipt of said one of said control signals and a second transistor having a first terminal connected to said second terminal of said sensing means, a second terminal connected to a second terminal of said data latch and a gate connected to said control means, said gate causing said second transistor to enter a conducting state upon receipt of said one of said control signals.

4. Data access apparatus according to claim 1 further including control means for generating a plurality of control and timing signals including said access control signals, and STORE and RECALL control signals and wherein said memory cell means is further responsive to said STORE and RECALL control signals, said memory cell means being a non-volatile dynamic random access memory (NVDRAM) cell of the type wherein said non-volatile memory element has a floating gate for storing a quantum of charge indicating a non-volatile data state and wherein said volatile memory has a shadow dynamic RAM (DRAM) element having a dynamic storage capacitor for storing a quantum of charge indicating a volatile data state, said memory cell means comprising:
  means for reading and writing data in the DRAM element;
  means for transferring data from the DRAM element to the non-volatile memory element in a store operation; and
  means for static sensing the non-volatile data state in said non-volatile memory element to transfer data from said non-volatile memory element to said DRAM element in a recall operation.

5. Data access apparatus according to claim 4 wherein said floating gate and said dynamic storage capacitor are formed by a stacked gate transistor structure.

6. Data access apparatus according to claim 5 wherein said stacked gate transistor structure comprises:
  said floating gate;
  first and second terminals and a conducting plate, with said first terminal and said conducting plate forming said dynamic storage capacitor; and
  a tunneling structure for charging and discharging said floating gate.

7. Data access apparatus according to claim 6 wherein said means for reading and writing data into said DRAM element comprises:

an input/output (I/O) line connected to said memory cell means terminal;
an access transistor connecting said I/O line to said dynamic storage capacitor; and
means for controlling the conductivity of said access transistor.

8. Data access apparatus according to claim 7 wherein said means for transferring data from said DRAM to said non-volatile memory element comprises:
  means for tunneling electrons between said floating gate and said first terminal to adjust the quantum of charge stored on said floating gate to correspond to the data state in said DRAM.

9. Data access apparatus according to claim 8 wherein said means for static sensing comprises:
  means for initializing the quantum of charge stored in said dynamic storage capacitor;
  a common line;
  a recall transistor connecting said second terminal of said stacked gate transistor structure to said common line; and
  means for controlling the conductivity of said recall transistor whereby the quantum of charge stored on said floating gate determines the amount of charge transfer between said initialized dynamic storage capacitor and said common line, thereby determining the state of the data element stored in said non-volatile memory element.

10. Data access apparatus according to claim 2 wherein said latch means further generates a signal at said second terminal from said temporarily stored signal further including comparator means having a first input responsive to said signal generated by said sensing means and a second input responsive to said signal generated by said latch means for generating a first signal when said signals at said first and second input are equal and a second signal otherwise.

11. Data access apparatus according to claim 10 wherein said sensing means is bidirectional, and wherein said memory cell means further receives at said terminal a signal and writes data corresponding to said signal to said non-volatile data element, whereby said temporarily-stored signal may be conducted to said bidirectional sensing means, said amplified signal generated therefrom applied to said memory cell means terminal and rewritten to said volatile data element therein.

12. Apparatus providing non-destructive access to at least two digital data elements comprising:
  control means for generating a plurality of control and timing signals, said control signals including access control signals;
  memory cell means responsive to said access control signals for storing at least a non-volatile digital data element and a volatile digital data element, and for generating at a terminal signals representative of said data stored within said data elements;
  sensing means responsive to said signals generated by said memory cell means for sampling said signals and for generating amplified signals therefrom; and
  latch means responsive to said signals generated by said memory cell means for temporarily storing said signals; and
  transfer means responsive to one of said control signals, connected to said sensing means for selectively conducting said signals between said sensing means and said latch means upon receipt of said one of said control signals;

whereby said digital data element stored in said volatile portion of said memory cell means is read therefrom and stored in said latch means in response to said one of said control signals and said non-volatile digital data element is sampled and a signal generated therefrom by said sensing means.

13. Apparatus providing non-destructive access to at least two digital data elements comprising:

control means for generating a plurality of control and timing signals, said control signals including access control signals;

memory cell means responsive to said access control signals for storing at least a non-volatile digital data element and a volatile digital data element, and for generating at a terminal signals representative of said data stored within said data elements, said memory cell means further receiving at said terminal a signal and writing data corresponding to said signal to said non-volatile data element;

bidirectional sensing means responsive to said signals generated by said memory cell means for sampling said signals and for generating amplified signals therefrom;

latch means responsive to said signals generated by said memory cell means for temporarily storing said signals and for generating a signal from said temporarily-stored signal;

transfer means responsive to one of said control signals, connected to said sensing means for selectively conducting said signals between said sensing means and said latch means upon receipt of said one of said control signals; and comparator means having a first input responsive to said signal generated by said sensing means and a second input responsive to said signal generated by said latch means for generating a first signal when said signals at said first and said second input are equal and a second signal otherwise;

whereby said digital data element stored in said volatile portion of said memory cell means is read therefrom and stored in said latch means in response to said one of said control signals and said non-volatile digital data element is sampled and a signal generated therefrom by said sensing means; and whereby said temporarily-stored signal may be conducted to said bidirectional sensing means, said amplified signal generated therefrom applied to said memory cell means terminal and rewritten to said volatile data element therein.

14. A method for the non-destructive read access of volatile and non-volatile digital data from memory cell means having a terminal responsive to access control signals including dynamic random access memory (DRAM) READ signal and a RECALL signal for storing at least a non-volatile digital data element and a volatile digital data element, for causing said data stored within said non-volatile data element to be transferred to said volatile data element upon receipt of said RECALL signal and for generating at said terminal a signal representative of signal causing a said data stored within said volatile data element, upon receipt of said DRAM READ signal said method comprising the steps of:

(a) receiving a first DRAM READ signal causing said memory cell means to generate a signal representative of said data stored within said volatile data element;

(b) temporarily storing said signal generated at step (a);

(c) receiving a RECALL signal causing said data stored within said non-volatile data element to be transferred to said volatile data element; and (d) receiving a second DRAM READ signal causing said memory cell means to generate a signal representative of said data stored within said non-volatile data element that was transferred to said volatile data element in step (c).

15. The non-destructive read access method of claim 14 further including latch means responsive to an enable signal for receiving data upon receipt of said enable signal and for temporarily storing said data as called for in step (b); and sensing means for sampling said signal generated in step (d) and for generating an amplified signal therefrom; and transfer means interposed between said sensing means and said latch means for selectively conducting signals between said sensing means and said latch means; and wherein step (b) further calls for sampling said signal generated in step (a), causing said transfer means to conduct signals to said latch means, subsequently enabling said latch means for temporarily storing said signal conducted thereto from said sensing means via said transfer means, wherein said method further includes the step of:

(e) sampling said signal generated in step (d) by said sensing means and generating an amplified signal therefrom.

16. The non-destructive read access method of claim 14 further including the steps of:

(f) comparing the signal temporarily stored in step (b) with the signal generated in step (d);

(g) generating a first signal indicative of said comparison called for in step (f) resulting in equality or generating a second signal indicative of said comparison resulting in inequality.

17. The non-destructive read access and comparison method of claim 16 wherein said memory cell means further receives at said terminal a signal and writes data corresponding to said signal to said volatile data element therein, said method further including the steps of:

(h) applying said data temporarily stored in step (b) to said memory cell means terminal; and (i) writing said data applied in step (h) to said volatile element of said memory cell means.

18. The non-destructive read access and comparison method of claim 15 wherein said memory cell means further receives at said terminal a signal and writes data corresponding to said signal to said volatile data element and wherein said latch means further generates a signal from said temporarily-stored signal, further including the steps of:

(j) causing said transfer means to conduct said signal generated by said latch means to said sense means;

(k) sampling said signal transferred in step (j) by said sensing means and generating an amplified signal therefrom;

(l) applying said signal generated in step (k) to said memory cell means terminal; and (m) writing said data applied in step (l) to said volatile element of said memory cell means.

* * * * *